(12) United States Patent
Jacobsen et al.

(10) Patent No.: US 7,213,197 B2
(45) Date of Patent: May 1, 2007

(54) ADAPTIVE BIT LOADING WITH LOW DENSITY PARITY CHECK FORWARD ERROR CORRECTION

(75) Inventors: Eric A. Jacobsen, Scottsdale, AZ (US); Valentine J. Rhodes, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 534 days.

(21) Appl. No.: 10/749,624

(22) Filed: Dec. 30, 2003

(65) Prior Publication Data

US 2005/0034053 A1    Feb. 10, 2005

Related U.S. Application Data

(60) Provisional application No. 60/493,937, filed on Aug. 8, 2003.

(51) Int. Cl.
*G06F 11/00* (2006.01)

(52) U.S. Cl. ....................................... 714/800
(58) Field of Classification Search ................. 714/800
See application file for complete search history.

(56) References Cited

U.S. PATENT DOCUMENTS

| | | |
|---|---|---|
| 5,479,447 A | 12/1995 | Chow et al. |
| 2003/0037298 A1 | 2/2003 | Eleftheriou et al. |
| 2003/0118090 A1 | 6/2003 | Redfern |

FOREIGN PATENT DOCUMENTS

WO    WO 01/97387 A1    12/2001

OTHER PUBLICATIONS

Lu et al., LDPC based space time coded OFDM systems over correlated fading channels: performance anaylsis and receiver design, Jan. 2002, IEEE Trans. on Comm. vol. 50, No. 1, p. 74-88.*
Yang et al., Wireless communication based on LDPC and adaptive space time coded MQAM, Apr. 2003, IEEE, p. 1354-1357.*
Han et al. Smart random channel access in OFDM systems by joint signal processing and packet scheduling, Jun. 2003, IEEE, International workshop on soft computing in Industrial applications, p. 133-137.*
Eberle et al., A digital 80Mb/s OFDM transceiver IC for wireless LAN in the 5GHz band, 2000, IEEE international solod state circuits conference, p. 1-3.*
European Patent Office, International Search Report and Written Opinion for International Application No. PCT/US2004/025215, 13 pages, Mar. 4, 2005.
Boyd Bangerter, et. al., "High-Throughput Wireless LAN Air Interface," Intel Technology Journal, vol. 7, Issue 3, Published Aug. 19, 2003, ISSN 1535-864X, pp. 47-57 (USA).
Eric Jacobsen, "LDPC FEC for IEEE 802.11n Applications" (Power Point Presentation), presented to IEEE 802.11 plenary session, Task Group n, on Nov. 10, 2003, slides 1-35.

* cited by examiner

*Primary Examiner*—Shelly Chase
(74) *Attorney, Agent, or Firm*—Alan Pedersen-Giles

(57) ABSTRACT

An apparatus may include an orthogonal frequency division multiplexing (OFDM) physical layer interface. An adaptive subcarrier demodulator or an adaptive subcarrier modulator may be coupled to the OFDM physical layer interface to implement adaptive bit loading (ABL). A decoder or an encoder may be coupled to the adaptive subcarrier demodulator or to the adaptive subcarrier modulator to implement low density parity checking.

16 Claims, 5 Drawing Sheets

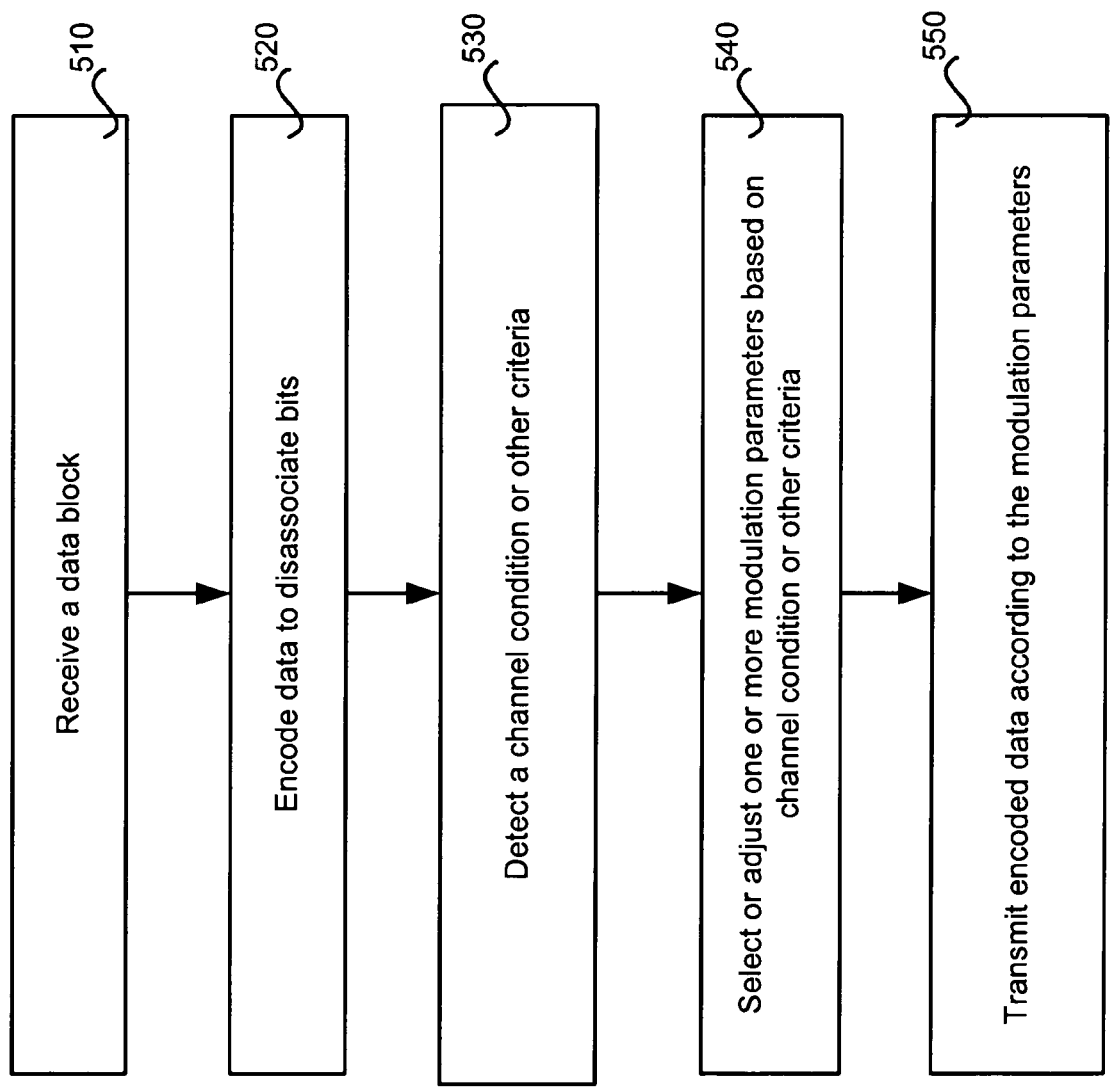

ADAPTIVE BIT LOADING WITH LOW DENSITY PARITY CHECK FORWARD ERROR CORRECTION

CROSS-REFERENCE TO RELATED APPLICATION

The present application claims the benefit of U.S. provisional application Ser. No. 60/493,937, filed Aug. 8, 2003, entitled "A High-Throughput Wireless Network Architecture, Apparatus And Associated Methods," the entire content of which is incorporated by reference herein.

BACKGROUND

The claimed invention relates to multicarrier communications and, more particularly, to adaptive modulation in multicarrier communications.

Multicarrier communications may be described as a communications technique in which multiple carriers or subcarriers are used to communicate information. As an example of multicarrier communications, Orthogonal Frequency Division Multiplexing (OFDM) may be described as a communications technique that divides a communications channel into a number of spaced frequency bands. In OFDM, a subcarrier carrying a portion of the user information may be transmitted in each band. In OFDM, each subcarrier may be orthogonal, differentiating OFDM from the commonly used frequency division multiplexing (FDM). An OFDM symbol may include, for example, a multicarrier symbol transmitted simultaneously on the OFDM subcarriers during the OFDM symbol period. The individual symbols on particular subcarriers may be referred to as subcarrier symbols.

In wireless systems that are susceptible to dynamic or frequency selective fading, such systems may benefit substantially from channel interleavers that interleave at the transmission bit level to break up fading that may be correlated within a transmission symbol. Some OFDM communication systems may also use Adaptive Bit Loading (ABL), which may also be referred to as adaptive subcarrier modulation, where the modulation density may be changed on a subcarrier-by-subcarrier basis based on channel conditions. Techniques such as ABL may complicate the bit interleaving process, however, because each OFDM symbol may contain a different number of bits whenever a new channel adaptation is made (e.g., transmission). It may be difficult to implement an efficient interleaving scheme when the number of bits may vary among OFDM symbols.

BRIEF DESCRIPTION OF THE DRAWINGS

The accompanying drawings, which are incorporated in and constitute a part of this specification, illustrate one or more implementations consistent with the principles of the invention and, together with the description, explain such implementations. In the drawings.

FIG. 5 is a flow chart illustrating operation of a transmitter according to an example implementation.

DETAILED DESCRIPTION

The following detailed description refers to the accompanying drawings. The same reference numbers may be used in different drawings to identify the same or similar elements. Also, the following detailed description illustrates certain implementations and principles, but the scope of the claimed invention is defined by the appended claims and equivalents.

Figure 1:
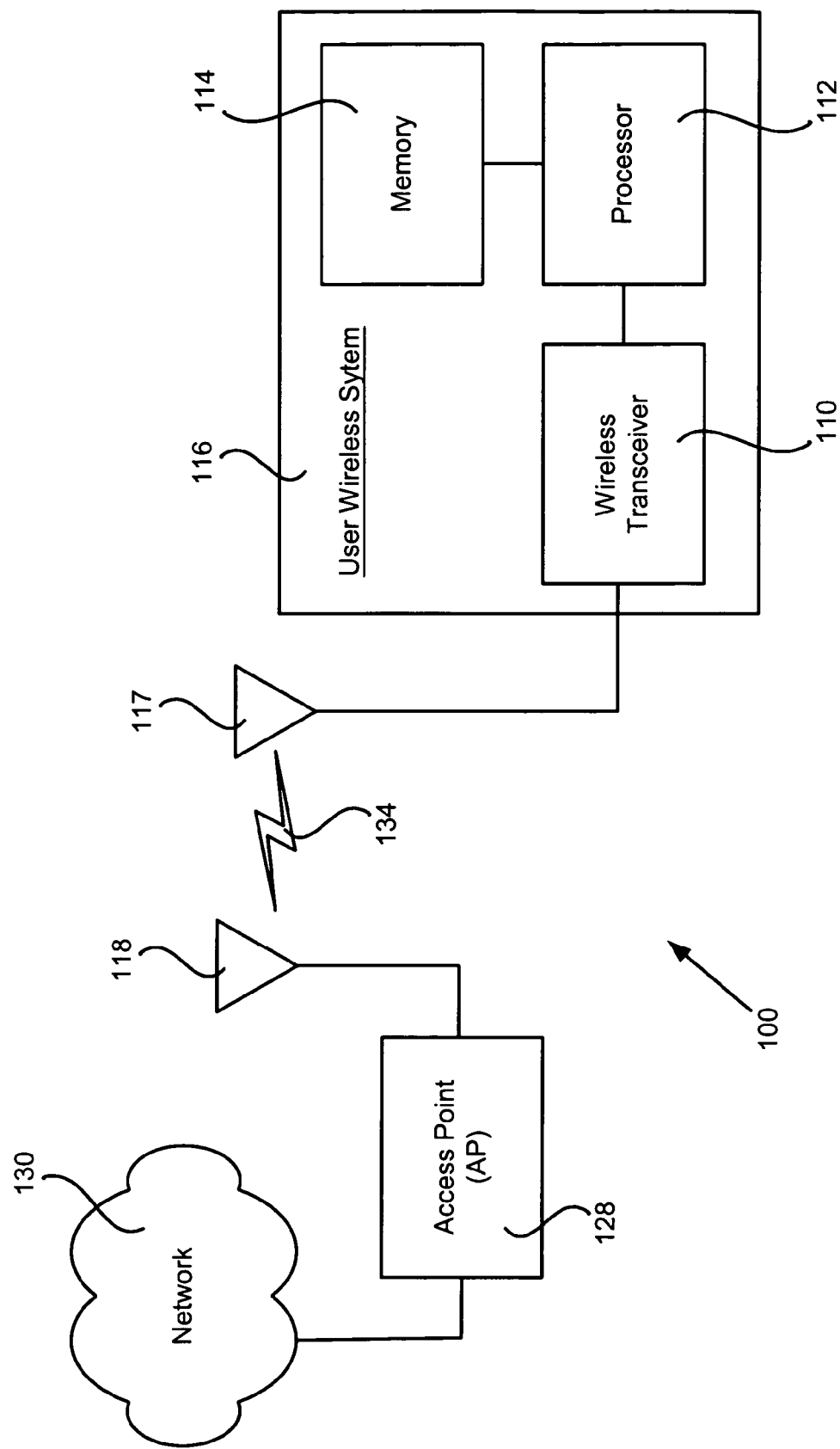
FIG. 1 illustrates an example wireless communication system consistent with the principles of the invention.

FIG. 1 is a diagram illustrating an example of a wireless communication system 100 in accordance with one implementation consistent with the principles of the invention. In communications system 100, a user wireless system 116 may include a wireless transceiver 110 coupled to an antenna 117 and to a processor 112. Processor 112 in one implementation may include a single processor, or may include a baseband processor and an applications processor, although the claimed invention is not limited in this respect. According to one implementation, processor 112 may include a baseband processor and Medium Access Control (MAC).

Processor 112 may couple to a memory 114 that may include volatile memory such as DRAM, non-volatile memory such as flash memory, or may include other types of storage such as a hard disk drive, although the claimed invention is not limited in this respect. Some portion, or all, of memory 114 may be included on the same integrated circuit as processor 112, or some portion or all of memory 114 may be disposed on an integrated circuit or other medium, for example a hard disk drive, that is external to the integrated circuit of processor 112. According to one implementation, software may be provided in memory 114 to be executed by processor 112 to allow wireless system 116 to perform a variety of tasks, some of which may be described herein.

Wireless system 116 may communicate with an access point (AP) 128 (or other wireless system) via wireless communication link 134. Access point 128 may include at least one antenna 118. Antennas 117 and 118 may include, for example, a directional antenna or an omni directional antenna, although the claimed invention is not limited thereto. Although not explicitly illustrated in FIG. 1, AP 128 may include, for example, a structure that is similar to wireless system 116, including one or more of a wireless transceiver, a processor, a memory, and software provided in memory to allow AP 128 to perform a variety of functions. In an example implementation, wireless system 116 and AP 128 may be stations in a wireless communication system, such as a wireless local area network (WLAN) system.

Access point 128 may be coupled to network 130 so that wireless system 116 may communicate with network 130, including devices coupled to network 130, by communicating with access point 128 via wireless communication link 134. Network 130 may include a public network such as a telephone network or the Internet, and/or network 130 may include a private and/or restricted-access network such as an intranet or extranet, or a combination of a public and a private network, although the claimed invention is not limited in this respect.

Communication between wireless system 116 and access point 128 may be implemented via a WLAN or other wireless network, such as a network which may be compliant with an Institute of Electrical and Electronics Engineers (IEEE) standard like IEEE 802.11a, IEEE 802.11b, IEEE 802.11g and so on, although the claimed invention is not limited in this respect.

In some implementations, communication between wireless system 116 and access point 128 may be implemented via a cellular communication network compliant with a 3GPP or other cellular standard, although the claimed invention is not limited in this respect.

According to an example implementation, system 100 may use adaptive modulation, such as ABL, in a multicarrier environment (e.g., OFDM). System 100 may include an encoder/decoder with decorrelating properties as will be described in greater detail below. According to an example implementation, such an encoder/decoder may, for example, be provided in addition to or instead of an interleaving/deinterleaving device, although the claimed invention is not limited in this regard.

Figure 2:
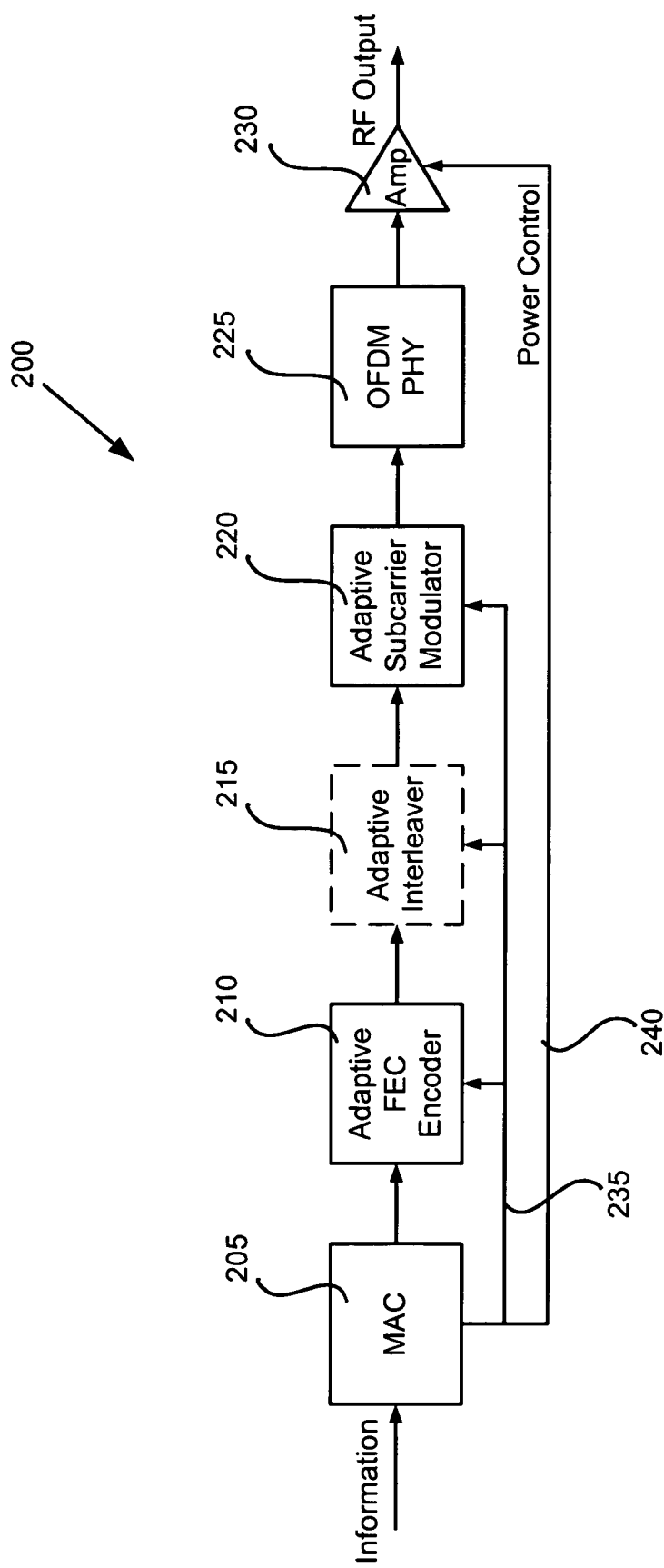
FIG. 2 illustrates an example transmitter consistent with the principles of the invention.

FIG. 2 is a block diagram of a transmitter 200 according to an example implementation. Transmitter 200 may modulate information and may perform other processing on information for transmission, and may be used in one or more elements of system 100. Transmitter 200 may include a media access controller (MAC) 205, an adaptive forward error correction (FEC) encoder 210, an optional adaptive interleaver 215, an adaptive subcarrier modulator 220, an OFDM PHY 225 and an amplifier 230, although the claimed invention is not limited thereto.

Transmitter 200 may receive information bits or a data block to be transmitted. The information is input to MAC 205. MAC 205 may perform many tasks, including tasks related to media access.

FEC encoder 210 is coupled to the output of MAC 205 and may perform FEC encoding or rate coding on the incoming information bits. FEC encoding may involve, for example, adding parity bits to the information bits to generate one or more codewords, although the claimed invention is not limited thereto. The parity bits may allow error detection and/or error correction to be performed at the demodulator or receiver.

In some implementations consistent with the principles of the invention, FEC encoder 210 may include circuitry and/or processor-implemented code that decorrelates or disassociates bits. One example of a suitable scheme for decorrelating may be a Low Density Parity Check (LDPC) encoder. An LDPC encoder may disassociate and/or decorrelate bits as a natural result of its operation, thereby facilitating the use of an adaptive modulation scheme, such as ABL, in transmitter 200. For example, an LDPC encoder may perform acceptably with both relatively short (e.g.,~100) and relatively long (e.g.,~$10^5$) block sizes that may be produced in an adaptive subcarrier modulation scheme, although the claimed invention is not limited to block sizes within this range.

In general the FEC block sizes may not be determined by the adaptive subcarrier modulation scheme. Interleaver 215 (or modulator 220), however, may match the OFDM symbol size to the FEC block size. The FEC block size may be determined, for example, by the design of the encoding and/or modulating code, or by the size of the data packet.

Although an LDPC encoder is one example, other encoding schemes that randomize encoded bits may be used. For example, a random or pseudo-random mapper, perhaps implemented via a look-up table, may be used. Also, it should be noted that as used herein "disassociate" is intended to describe separating bits that would otherwise appear together and that may experience, or have experienced, correlated channel fading. Although decorrelation may be considered as one type of disassociation, various schemes other than decorrelation in the strict mathematical sense may be used to disassociate bits.

Optional interleaver 215 may, or may not, be coupled to an output of FEC encoder 210. For example, interleaver 215 may interleave bits in various OFDM subcarriers (e.g., either linearly or by interleaving the bits or codewords), although the claimed invention is not limited thereto. Optional interleaver 215 may be omitted in some implementations from transmitter 200, due to the presence of a randomizing encoder 210, although the claimed invention is not limited thereto.

Adaptive subcarrier modulator 220 may be coupled to an output of adaptive interleaver 215, if present. In the absence of interleaver 215, modulator 220 may be coupled to FEC encoder 210, although the claimed invention is not limited thereto. Adaptive subcarrier modulator 220 may adaptively modulate one or more bits onto one or more carriers or subcarriers using a modulation scheme or schemes. For example, subcarrier modulator 220 may modulate bits (e.g., FEC encoded bits) onto a plurality of OFDM subcarriers, although the claimed invention is not limited thereto.

Adaptive subcarrier modulator 220 may modulate bits using a selected one of a number of modulation schemes. For example, one modulation scheme may be adaptively selected for all OFDM subcarriers based on a detected criteria, such as a detected channel condition or channel conditions. On the other hand, the channel condition or other criteria may be detected for each subcarrier, and then a different modulation scheme may be used for each OFDM subcarrier based on the channel condition for that particular subcarrier, although the invention is not limited thereto. Further, subcarriers may be grouped (e.g., in twos, fours, etc.) into subbands so that modulation schemes need not be individually selected for each subcarrier, but one modulation scheme may be selected for the subband.

Adaptive subcarrier modulator 220 may use any of a variety of modulation schemes. Some example modulation schemes may include binary phase shift keying (BPSK) which transmits two different symbols (1 bit per symbol), quadrature phase shift keying (QPSK), 8-PSK (8 different symbols encoding 3 bits/symbol), quadrature amplitude modulation (QAM), QAM 16 (16 different symbols to encode 4 bits/symbol), QAM 32, QAM 64, QAM 256, etc. These are just a few example modulation schemes and the claimed invention is not limited thereto. Compared to lower level modulation schemes, the higher level modulation schemes may provide a higher data rate due to a greater number of bits per symbol for higher level modulation schemes. However, it may be more difficult to correctly recover the data at the receiver for higher level modulation schemes due to the increased number of possible symbols. Therefore, according to an example implementation, an adaptive modulation scheme (e.g., ABL) may be used that is based upon a detected channel condition. This may allow a higher level modulation scheme to be used for higher quality channels, and a lower level modulation scheme to be used for a lower quality channel, although the invention is not limited thereto.

A PHY (e.g., physical layer interface), such as a OFDM PHY 225 may be coupled to an output of adaptive subcarrier modulator 220. OFDM PHY 225 may generate signals having the appropriate qualities, such as the appropriate voltages, timing, etc. Amplifier 230 may be coupled to an output of OFDM PHY 225 to amplify the signals output from the PHY 225. The signals generated by amplifier 230 may be transmitted via an antenna over a wireless channel, for example, or over another type of channel.

MAC 205 may control or coordinate via line 235 the operation of one or more of FEC encoder 210, adaptive interleaver 215 (if present), and adaptive subcarrier modulator 220, although the claimed invention is not limited thereto. MAC 205 may also control or coordinate via line 240 a level of amplification performed by amplifier 230.

Figure 3:
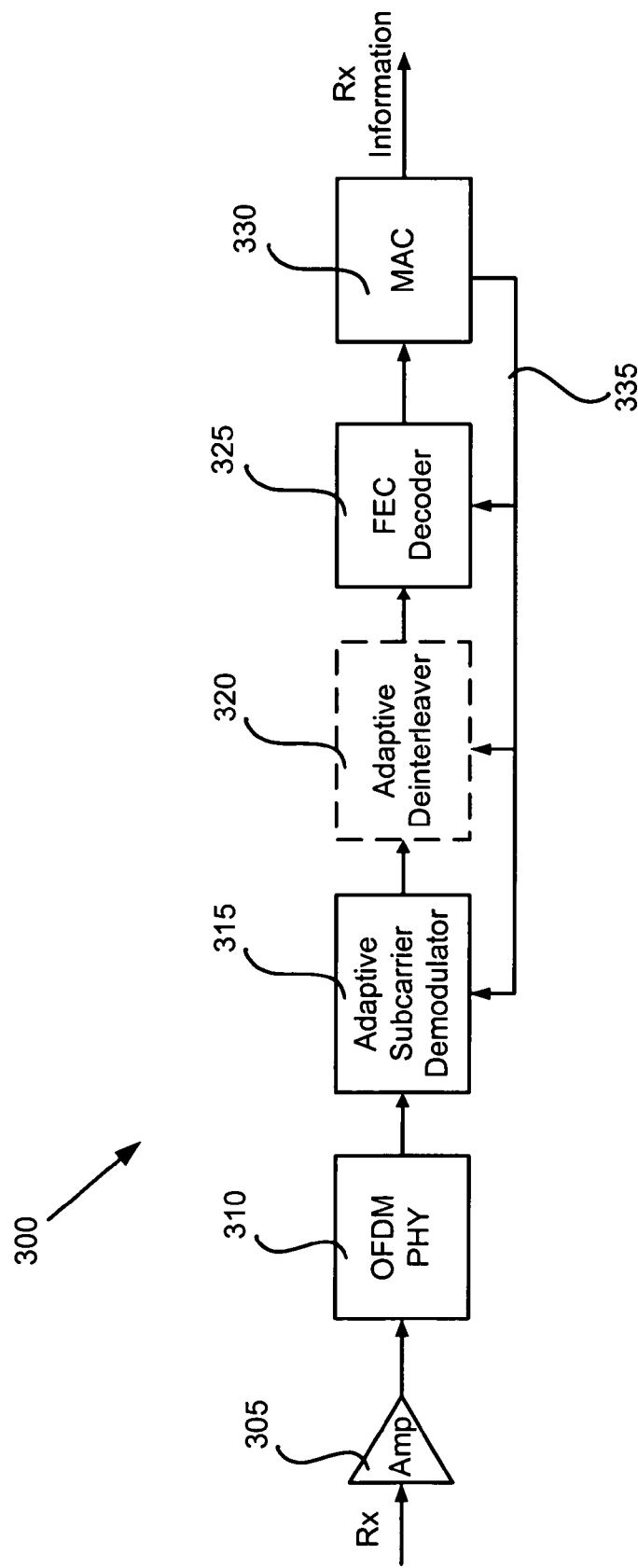
FIG. 3 illustrates an example receiver consistent with the principles of the invention.

FIG. 3 is a block diagram of a receiver 300 according to an example implementation. Receiver 300 may receive information and may perform other processing after reception, and may be used in one or more elements of system 100. Receiver 300 may include an amplifier 305, an OFDM PHY 310, an adaptive subcarrier demodulator 315, an optional adaptive deinterleaver 320, an FEC decoder 325 and a MAC 330, although the claimed invention is not limited thereto.

Rx data may be received via a wireless channel through an antenna (not shown in FIG. 3) or other channel and passed to amplifier 305. OFDM PHY 310 may be coupled to the output of amplifier 305, and may generate signals having the appropriate qualities (e.g., appropriate voltages, timing, etc.).

Adaptive subcarrier demodulator 315 may be coupled to OFDM PHY 310 and may demodulate one or more received signals, for example demodulating one or more OFDM subcarriers. As described above, demodulator 315 may demodulate groups of subcarriers (e.g., two or more) that have been given a common modulation.

Optional adaptive de-interleaver 320 may be coupled to subcarrier demodulator 315 to de-interleave received signals in some implementations. In other implementations consistent with the principles of the invention, de-interleaver 320 may be omitted, and demodulator 315 may be coupled to FEC decoder 325.

FEC decoder 325 may coupled to an output of de-interleaver 320, if present, to decode codewords into data bits. In some implementations consistent with the principles of the invention, FEC decoder 325 may include circuitry and/or processor-implemented code that disassociates and/or decorrelates bits. In some implementations, even though the bits may be locally disassociated from their received ordering, they may be in some sense "re-associated" to reassemble bits in to an order before operated on by FEC encoder 210. One example of a suitable scheme for such disassociating may be a Low Density Parity Check (LDPC) decoder. An LDPC decoder may separate (e.g., re-associate) bits that may have suffered correlated fading as a natural result of its operation, thereby facilitating the use of an adaptive modulation scheme, such as ABL, in receiver 300. Other encoding schemes that de-randomize decoded bits may be used.

MAC 330 may control the operation of one or more of adaptive subcarrier demodulator 315, adaptive de-interleaver 320 (if present), and FEC decoder 325. MAC 330 may perform tasks related to media access to a channel and other tasks. MAC 330 may receive control information from a remote node, for example provided in one or more fields or messages, that may indicate one or more selected transmission parameters. MAC 330 may then control, based on the received control information, various blocks of receiver 300, including to control adaptive subcarrier demodulator 315 to demodulate according to one or more specified modulation schemes, to control de-interleaver 320 to perform (or not perform) de-interleaving, to control FEC decoder 325 to FEC decode using a selected rate code, etc., although the invention is not limited thereto. The resulting data may be output by MAC 330.

Returning to FIG. 1, in an example implementation, transceiver 110 may include one or both of transmitter 200 and receiver 300, and MAC 235 and MAC 330 may include the same MAC for example, although the invention is not limited thereto. Transceiver 110 may include additional blocks or components.

Figure 4:
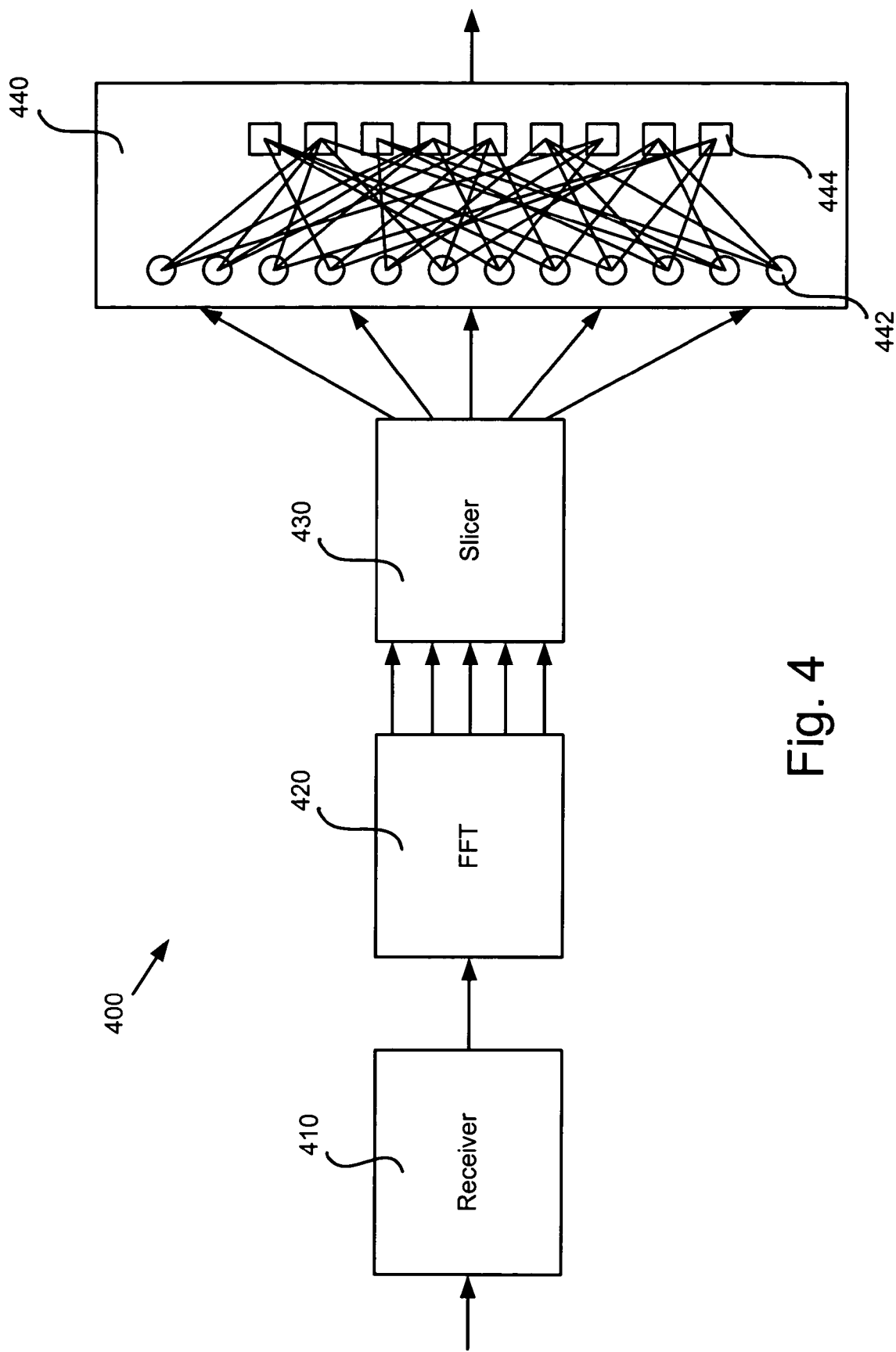
FIG. 4 illustrates another example receiver consistent with the principles of the invention.

FIG. 4 illustrates another example receiver 400 consistent with the principles of the invention. Receiver 400 may be considered to be a specific implementation of receiver 300 without a deinterleaver, and may include a receiver 410, a fast Fourier transform (FFT) module 420, a slicer 430, and an LDPC decoder 440. Some elements of receiver 400 may not be shown for ease of explanation.

Receiver 410 may include, for example, elements similar in function to the previously-described amplifier 305 and OFDM PHY 310. Receiver 410 may provide a received signal to FFT module 420.

FFT module 420 may demodulate the received signal and provide demodulated constellation symbols in some implementations consistent with the principles of the invention. Slicer 430 may receive the demodulated constellation symbols and may slice them based on the encoding scheme to produce detected coded bits. FFT 420 and slicer 430 may operate together to adaptively demodulate differently-modulated subcarriers, or groups of subcarriers. FFT 420 and slicer 430 may demodulate received symbols that were encoded with an ABL or another adaptive subcarrier modulation scheme.

LDPC decoder 440 may decode the detected coded bits to produce corrected bits at its output. LDPC decoder 440 may include a number of bit nodes 442 and check nodes 444 arranged to perform the decoding. Bit nodes 442 may be connected to check nodes 444 by a number of edges, the arrangement of which may determine performance of decoder. For example, one LDPC code may be a (2000, 1600) code, with R=0.8. Such a code may have 2000 bit nodes 442 and 1600 check nodes 444, with four edges per information bit and two per parity bit. There may be 18 edges per check node and a total of 7199 edges in such an LDPC code. Although this is one example of a suitable LDPC code, the claimed invention is not limited thereto.

FIG. 5 is a flow chart illustrating operation of a transmitter according to an example implementation. At 510, the transmitter receives a data block, which may be a group of information bits. The block of data may be of variable size, although the claimed invention is not limited thereto.

At 520, FEC encoder 210 may encode the data to decorrelate the bits therein. FEC encoder 210 may use, for example, an LDPC scheme, which intrinsically decorrelates, to perform such encoding. The LDPC encoding may be performed via dedicated hardware, software/firmware, or some combination thereof. FEC encoder 210 may in other implementations use another error control code that has decorrelation properties.

At 530, transmitter 200 (e.g., MAC 205) may detect a channel condition or other criteria. The channel condition may provide information to the transmitter 200 that describes the current condition or quality of a channel (or carrier or subcarrier). Various frequency bands or channels may experience various types of interference, noise, selective fading and other conditions which may degrade the quality of a channel, from time to time. Transmitter 200 may detect the channel condition of a particular frequency band or bands using a variety of different techniques, including measuring bit error rate (BER), measuring packet error rate or packet transmission failure rate, measuring signal to noise ratio (SNR) for received signals, exchanging Channel Side Information (CSI) with another terminal, maintaining and updating a channel estimate which may estimate the current condition or quality of a channel, etc. These are just a few examples of how a channel condition may be detected, although the claimed invention is not limited thereto.

In a multicarrier system, such as an OFDM system, where information is transmitted over multiple carriers or subcarriers, the MAC 205 may measure the channel condition for a number (e.g., one or more) of the different subcarriers, although the claimed invention is not limited thereto.

At 540, MAC 205 and/or PHY 225 may select (or adjust) one or more modulation parameters to more efficiently use the OFDM symbols for transmission of the data block and/or to reduce any unused portion(s) of OFDM symbols (OFDM subcarriers). The modulation scheme may be selected or adjusted for one or more OFDM subcarriers, and there may be one modulation scheme used for one or more OFDM subcarriers, possibly even all subcarriers, although the claimed invention is not limited thereto. Alternatively, there may be a modulation scheme selected by MAC 205 and/or PHY 225 for OFDM subcarriers (e.g., adaptive subcarrier modulation or ABL), for example, based upon one or more detected channel conditions for the subcarriers, although the claimed invention is not limited thereto. The same modulation scheme may be applied to a group of two or more subcarriers (e.g., two, three, four, etc.) if such does not harm performance beyond an acceptable level.

According to an example implementation, different thresholds for the detected channel condition may be used to select different modulation schemes, although the claimed invention is not limited thereto. For example, if the detected channel condition meets a first threshold, then a first modulation scheme may be used for that channel or subcarrier. If the detected channel condition meets a second threshold, then a second modulation scheme may be used for the channel or subcarrier.

At 550, the data block may be processed and transmitted according to the selected transmission parameters. This may involve, for example, performing OFDM subcarrier modulation, and then amplifying the data for transmission over a channel, although the claimed invention is not limited thereto. This processing and transmission may be accomplished, for example, by MAC 205 providing control information via line 235 to control adaptive subcarrier modulator 220 to modulate the one or more OFDM subcarriers using the one or more selected modulation schemes, etc., although the claimed invention is not limited thereto.

Although flow charts are not explicitly presented for receivers 300 and 400, it will be appreciated that the acts in FIG. 5 may be substantially reversed to recover the encoded and modulated data. For example, after reception demodulator 315 may perform demodulation on a (sub)carrier-by-(sub)carrier basis (or groups thereof) to functionally undo act 540. Demodulator 315 may demodulate, for example, in accordance with an ABL scheme. Similarly, FEC decoder 325 may perform LDPC processing, or other decoding with similar decorrelating properties, to decode the coded data received from demodulator 315.

The foregoing description of one or more implementations consistent with the principles of the invention provides illustration and description, but is not intended to be exhaustive or to limit the claimed invention to the precise form disclosed. Modifications and variations are possible in light of the above teachings or may be acquired from practice of the invention.

Moreover, the acts in FIG. 5 need not be implemented in the order shown; nor do all of the acts necessarily need to be performed. Also, those acts that are not dependent on other acts may be performed in parallel with the other acts. Further, the acts in this figure may be implemented as instructions, or groups of instructions, implemented in a machine-readable medium.

No element, act, or instruction used in the description of the present application should be construed as critical or essential to the invention unless explicitly described as such. Also, as used herein, the article "a" is intended to include one or more items. Where only one item is intended, the term "one" or similar language is used. Variations and modifications may be made to the above-described implementation(s) of the claimed invention without departing substantially from the spirit and principles of the invention. All such modifications and variations are intended to be included herein within the scope of this disclosure and protected by the following claims.

What is claimed is:

1. A transmitter, comprising:
    an encoder to encode and disassociate data;
    an adaptive subcarrier modulator coupled to the encoder to adaptively select one or more subcarrier modulation schemes based on at least one condition of a communication channel; and
    a media access controller coupled to the encoder.

2. The transmitter of claim 1, wherein the encoder includes:
    a low density parity check (LDPC) portion.

3. The transmitter of claim 2, wherein the LDPC portion includes:
    a plurality of bit nodes to receive the data, and
    a plurality of check nodes selectively connected to the plurality of bit nodes.

4. The transmitter of claim 1, wherein the adaptive subcarrier modulator implements an adaptive bit loading (ABL) modulation scheme.

5. The transmitter of claim 1, wherein the transmitter does not include an interleaver.

6. The transmitter of claim 1, further comprising:
    an orthogonal frequency division multiplexing (OFDM) physical layer interface coupled to an output of the adaptive subcarrier modulator.

7. A receiver, comprising:
    an orthogonal frequency division multiplexing (OFDM) physical layer interface;
    a forward error correction (FEC) decoder coupled to the OFDM physical layer interface to implement low density parity checking; and
    a media access controller coupled to the FEC decoder.

8. The receiver of claim 7, further comprising:
    an adaptive subcarrier demodulator coupled between the FEC decoder and the OFDM physical layer interface.

9. The receiver of claim 7, wherein the adaptive subcarrier demodulator implements an adaptive bit loading (ABL) demodulation scheme.

10. The receiver of claim 7, wherein the receiver does not include a deinterleaver.

11. An apparatus, comprising:
    an orthogonal frequency division multiplexing (OFDM) physical layer interface; and
    an adaptive subcarrier demodulator or an adaptive subcarrier modulator coupled to the OFDM physical layer interface to implement adaptive bit loading (ABL);
    a decoder or an encoder coupled to the adaptive subcarrier demodulator or to the adaptive subcarrier modulator to implement low density parity checking; and
    a media access controller coupled to the adaptive subcarrier demodulator or to the adaptive subcarrier modulator.

12. The apparatus of claim 11, further comprising:
an amplifier coupled to the OFDM physical layer interface.

13. The apparatus of claim 11, wherein the apparatus does not include a deinterleaver or an interleaver.

14. A method in an orthogonal frequency division multiplexing (OFDM) system, comprising:
encoding information with a low density parity check (LDPC) code;
detecting a channel condition for one or more OFDM subcarriers; and
selecting a modulation scheme for the encoded information on one or more OFDM subcarriers based on the detected channel condition.

15. The method of claim 14 wherein the selecting includes:
selecting a modulation scheme for a group of two or more OFDM subcarriers based upon a detected channel condition for at least one of the two or more OFDM subcarriers.

16. The method of claim 14 wherein the selecting includes:
selecting the modulation scheme via adaptive bit loading (ABL).

* * * * *